United States Patent
Kidwell, Jr. et al.

(10) Patent No.: US 10,867,740 B2
(45) Date of Patent: Dec. 15, 2020

(54) INDUCTOR APPARATUS AND METHOD OF FABRICATING

(71) Applicant: QUALCOMM Incorporated, San Diego, CA (US)

(72) Inventors: Donald William Kidwell, Jr., Los Gatos, CA (US); Ravindra Vaman Shenoy, Dublin, CA (US); Alan Lewis, Sunnyvale, CA (US); Christopher Feuling Ferguson, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 301 days.

(21) Appl. No.: 15/826,735

(22) Filed: Nov. 30, 2017

(65) Prior Publication Data

US 2019/0164681 A1 May 30, 2019

(51) Int. Cl.
*H01F 27/24* (2006.01)
*H01F 27/28* (2006.01)
(Continued)

(52) U.S. Cl.
CPC ..... *H01F 27/2804* (2013.01); *H01F 17/0033* (2013.01); *H01F 27/24* (2013.01); *H01F 27/323* (2013.01); *H01F 41/041* (2013.01); *H01F 41/046* (2013.01); *H01F 41/122* (2013.01); *H01L 23/5227* (2013.01); *H01L 23/645* (2013.01); *H01L 28/10* (2013.01); *H01F 2027/2809* (2013.01); *H01L 2924/1206* (2013.01)

(58) Field of Classification Search
CPC .. H01F 5/00; H01F 27/00–40; H01F 27/2804; H01F 41/122; H01F 41/041; H01L 28/10

USPC ............. 336/65, 83, 200, 232–233, 206–208
See application file for complete search history.

(56) References Cited

U.S. PATENT DOCUMENTS 9,496,213 B2   11/2016   Kidwell, Jr. et al.
9,679,958 B2 *  6/2017   Sturcken et al.
                         (Continued)

FOREIGN PATENT DOCUMENTS

WO     2016202949 A1     12/2016
WO  WO-2016202949 A1 *  12/2016  ......... H01F 17/0033

OTHER PUBLICATIONS

International Search Report and Written Opinion—PCT/US2018/059726—ISA/EPO—dated Feb. 15, 2019.

*Primary Examiner* — Tuyen T Nguyen
(74) *Attorney, Agent, or Firm* — Qualcomm Incorporated

(57) ABSTRACT

Some aspects pertain to an inductor apparatus that includes a first metal layer including a plurality of first interconnects, a second metal including a plurality of second interconnects, a first dielectric layer between the first metal layer and the second metal layer, and an inductor. The inductor includes a plurality of vias, where the plurality of vias are configured to couple the plurality of first interconnects to the plurality of second interconnects. The inductor includes a plurality of inductor loops formed by the plurality of vias, the plurality of first interconnects and the plurality of second interconnects. The inductor further includes a first magnetic layer and a second magnetic layer, located between the first interconnects and the second interconnects; and a third magnetic layer and an optional fourth magnetic layer outside of the plurality of inductor loops.

28 Claims, 10 Drawing Sheets

(51) Int. Cl.
  *H01F 41/04* (2006.01)
  *H01F 41/12* (2006.01)
  *H01L 23/64* (2006.01)
  *H01F 27/32* (2006.01)
  *H01L 23/522* (2006.01)
  *H01L 49/02* (2006.01)
  *H01F 17/00* (2006.01)

(56) References Cited

U.S. PATENT DOCUMENTS

| | | |
|---|---|---|
| 2002/0097129 A1 | 7/2002 | Johnson et al. |
| 2007/0222550 A1* | 9/2007 | Fujiwara ............ H01F 17/0033 336/200 |
| 2008/0198560 A1* | 8/2008 | Fujiwara ............ H01F 17/0013 361/728 |
| 2017/0062120 A1 | 3/2017 | Yun et al. |

* cited by examiner

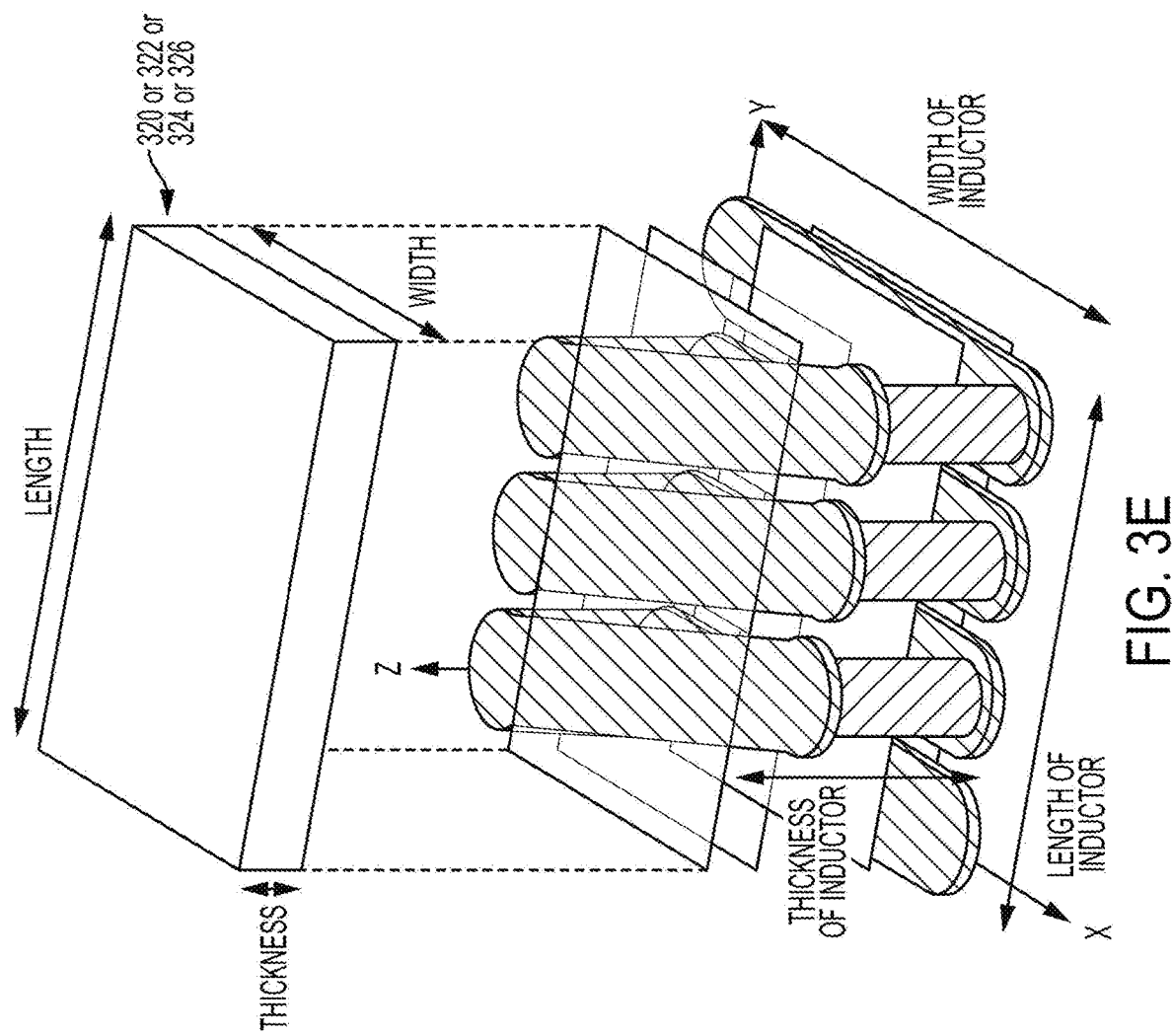

INDUCTOR APPARATUS AND METHOD OF FABRICATING

BACKGROUND

Field of the Disclosure

Various aspects relate to an inductor apparatus embedded in a substrate.

Background

Integrated circuits, integrated circuit packages and electronic devices are being continually driven to smaller form factors. There is also a need for inductors with high inductance density that satisfy the need for a smaller form factor.

FIG. 1 shows an example of an inductor in a packaged system. Specifically, FIG. 1 illustrates a packaged system 100 that includes a die 102, a plurality of first interconnects 104, a substrate 106, a plurality of second interconnects 108, an inductor 110, and a printed circuit board (PCB) 112. The inductor 110 is coupled to the PCB 112. The inductor 110 requires extra space on the PCB. One drawback of the inductor 110 is that it creates a device or packaged system 100 that has a surface area larger than needed. For example, the packaged system 100 may be too large for mobile computing devices or wearable computing devices. Another drawback of the inductor 110 is that it is far away from the die 102. In applications such as radio frequency and voltage regulators, the inductor should be close to the die 102.

In other aspect (not shown), the inductor 110 may be embedded inside of the PCB 112. One drawback of this aspect is the space necessary for routing of the inductor to other devices. In another aspect (not shown), the inductor 110 may be mounted on the backside (i.e., the opposing side) of the PCB 112. The backside of the PCB 112 may have solder balls (not shown) for coupling to other devices. One drawback of this aspect is that it requires depopulation of the solder balls to make space for the inductor 110.

FIG. 2 shows an example of a solenoid inductor embedded in a substrate, in a cross-section view. Specifically, FIG. 2 illustrates a substrate 200, including a first metal layer 202, a first dielectric layer 204, a second metal layer 206, a second dielectric layer 210, a third metal layer 212, a third dielectric layer 214, a fourth metal layer 216, and a plurality of vias 218. In one aspect, the second dielectric layer 210 may be in the form of prepreg material if the substrate 200 is a traditional substrate with a core. In another aspect, the second dielectric layer 210 may be any commonly used dielectric if the substrate 200 is a coreless substrate. The second dielectric layer 210 will have a larger thickness if substrate 200 is a traditional substrate with a core, as compared with the aspect where the substrate 200 is a coreless substrate.

The first metal layer 202 and the fourth metal layer 216 may be ground or power planes. FIG. 2 also illustrates a first inductor 208 including the plurality of vias 218 and the second metal layer 206 and the third metal layer 212. The first inductor 208 is embedded in the substrate 200. The first inductor 208 may be a three dimensional solenoid inductor. The inductor loops of the first inductor 208, are formed by the plurality of vias 218, the second metal layer 206, and the third metal layer 212. The second metal layer 206 and the third metal layer 212 are in the X, Y plane and form a portion of the inductor loops. The plurality of vias 218 are in the Z plane and form a portion of the inductor loops.

The embedded inductor 208 generates a magnetic field when current is applied through the embedded inductor 208. The magnetic field surrounding the embedded inductor 208 can interact with the nearby first metal layer 202 and fourth metal layer 216, such that the effective inductance of the embedded inductor 208 is greatly reduced. To avoid this problem, the first metal layer 202 and the fourth metal layer 216 are placed further away (in the z direction), or open space is created in the X, Y plane and the first metal layer 202 and the fourth metal layer 216 are not allowed above or below the inductor 208. The problem is that this makes the overall substrate 200 larger and therefore makes it more difficult to make a small device for use in a mobile computing device or wearable computing device.

Accordingly, there is need for an improved inductor that may be placed very close to a die (e.g., die 102) that allows for a smaller compact substrate (e.g., substrate 200).

SUMMARY

Various aspects relate to an inductor apparatus.

A first example provides an inductor apparatus includes a first metal layer including a plurality of first interconnects, a second metal layer including a plurality of second interconnects, a first dielectric layer between the first metal layer and the second metal layer, and an inductor. The inductor includes a plurality of vias, the plurality of vias are configured to couple the plurality of first interconnects to the plurality of second interconnects, a plurality of inductor loops formed by the plurality of vias, the plurality of first interconnects and the plurality of second interconnects, a first magnetic layer and a second magnetic layer between the plurality of first interconnects and the plurality of second interconnects, and a third magnetic layer outside of the plurality of inductor loops. Optionally, the inductor apparatus may include a fourth magnetic layer outside the plurality of inductor loops.

A second example provides a method of fabricating an inductor apparatus, including depositing a first magnetic layer and a second magnetic layer inside of a first dielectric layer, forming a plurality of vias in the first dielectric layer, patterning a plurality of first interconnects, and a plurality of second interconnects coupled together through the plurality of vias, wherein the plurality of vias, the plurality of first interconnects and the plurality of second interconnects form a plurality of inductor loops, and depositing a third magnetic layer outside the plurality of inductor loops, wherein the first magnetic layer and the second magnetic layer are located between the plurality of first interconnects and the plurality of second interconnects.

DRAWINGS

Various aspects, nature and advantages may become apparent from the detailed description set forth below when taken in conjunction with the drawings in which like reference characters identify correspondingly throughout.

DETAILED DESCRIPTION

Figure 1:
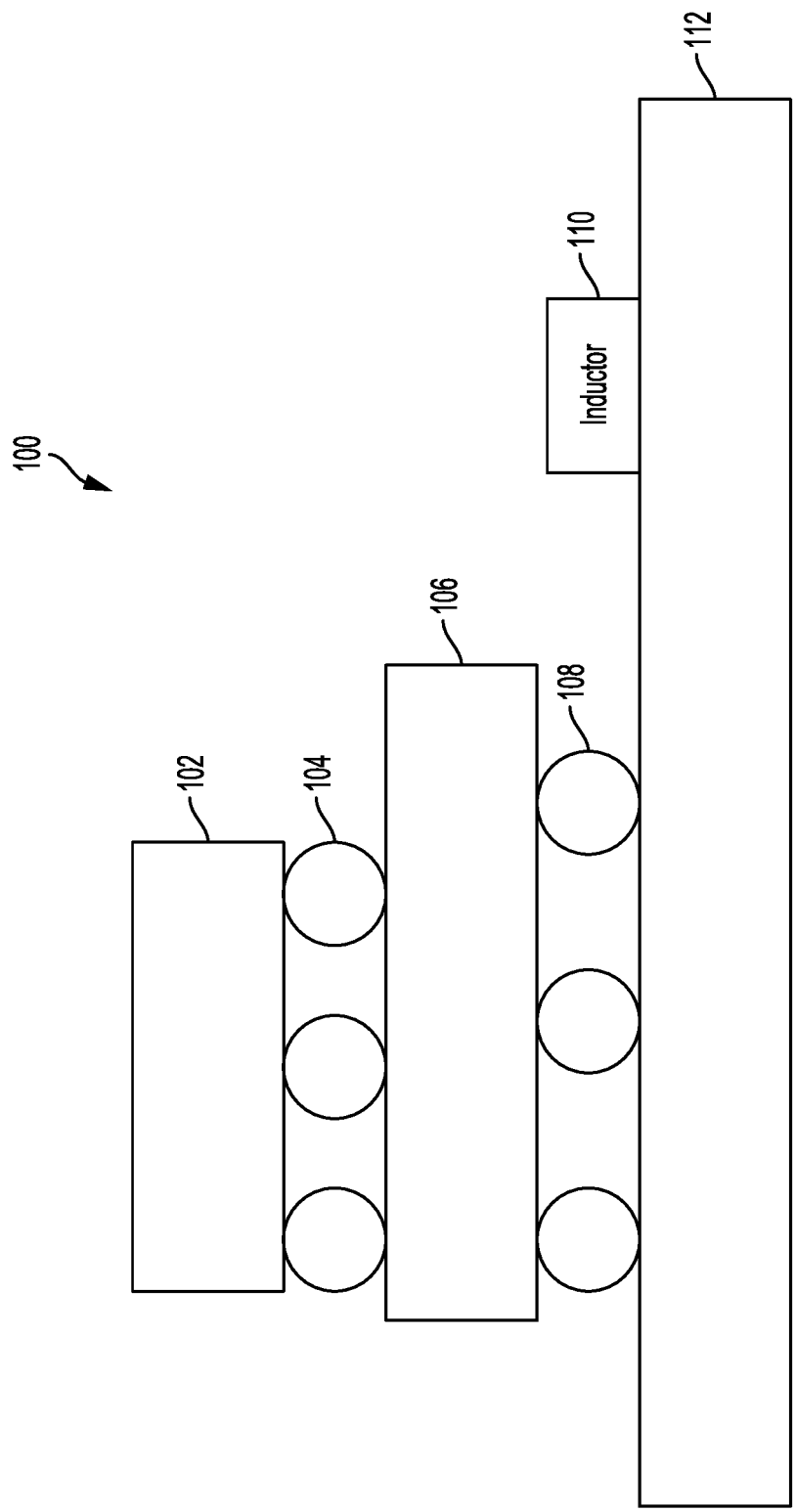
FIG. 1 illustrates a conventional inductor in a packaged system.
Figure 2:
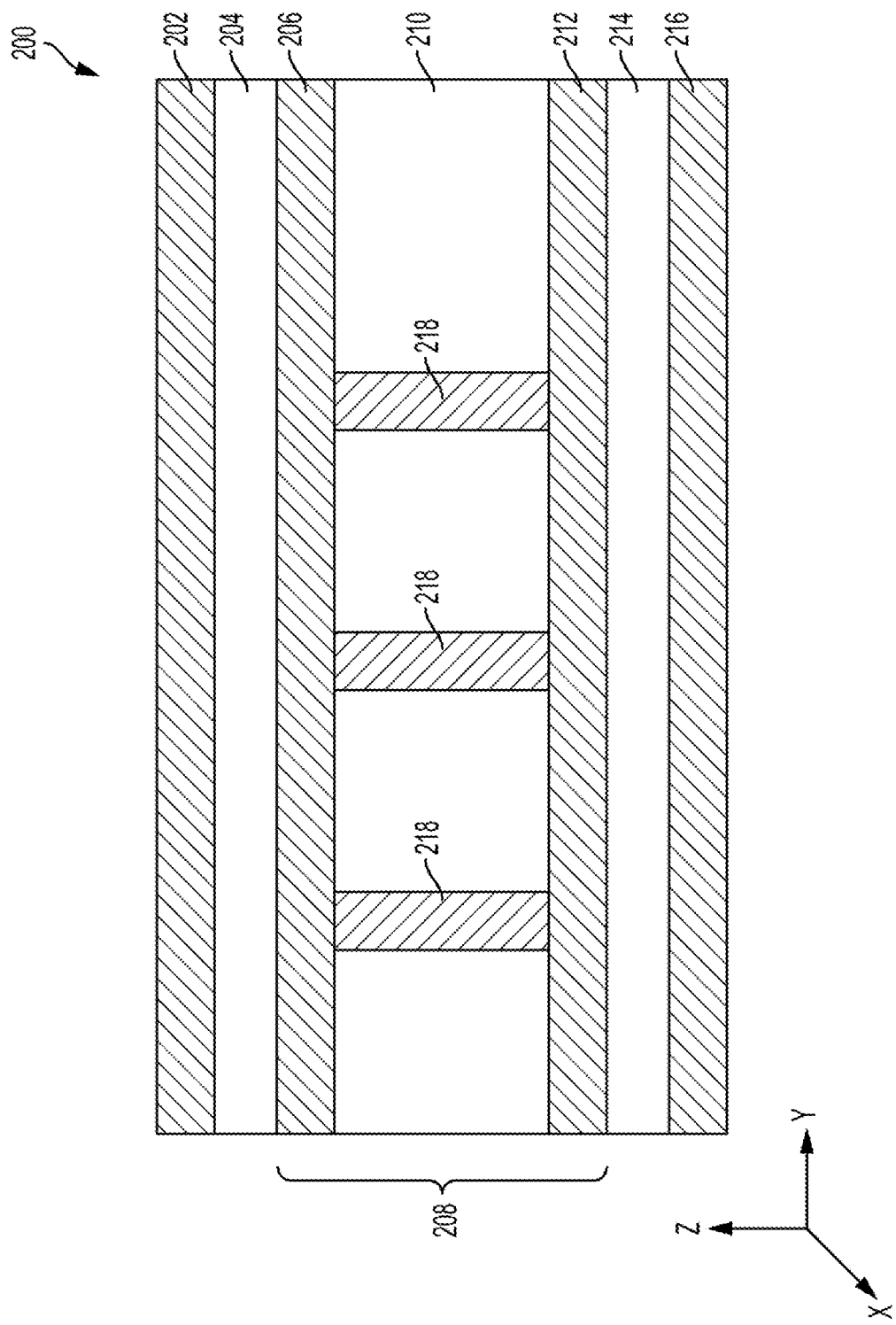
FIG. 2 illustrates a conventional solenoid inductor embedded in a substrate.

In the following description, specific details are given to provide a thorough understanding of the various aspects of the disclosure. However, it will be understood by one of ordinary skill in the art that the aspects may be practiced without these specific details. For example, circuits may be shown in block diagrams to avoid obscuring the aspects in unnecessary detail. In other instances, well-known circuits, structures and techniques may not be shown in detail in order not to obscure the aspects of the disclosure.

Overview

Some aspects pertain to an inductor apparatus. The inductor apparatus is three dimensional. The inductor apparatus includes a first metal layer including a plurality of first interconnects, a second metal layer including a plurality of second interconnects, and a first dielectric between the first metal layer and the second metal layer. The inductor apparatus also includes an inductor including a plurality of first vias and a plurality of second vias configured to couple the plurality of first interconnects to the plurality of second interconnects. The inductor loops are formed by the plurality of first vias, the plurality of second vias, the plurality of first interconnects and the plurality of second interconnects. The inductor has a first magnetic layer and a second magnetic layer located inside of the inductor loops. In other words, the first magnetic layer and the second magnetic layer are located between the first and second interconnects. The inductor also has a third magnetic layer located outside of the inductor loops. The third magnetic layer is parallel to the plurality of first interconnects and at least partially aligned with the plurality of first interconnects. The inductor has an optional fourth magnetic layer located outside of the inductor loops. The fourth magnetic layer is parallel to the plurality of second interconnects and at least partially aligned with the plurality of second interconnects. The first, second, third and optional fourth magnetic layers provide a pathway of higher permeability than the surrounding dielectric material, thus constraining and guiding the magnetic field lines and increasing the inductance density.

In one aspect, the inductor apparatus, may be a standalone component configured to be placed with another component that will utilize the inductor. In another aspect, the inductor apparatus may be integrated or embedded into a substrate that includes the inductor apparatus (i.e., includes the inductor in the first metal layer and second metal layer) as well as other components or structures such as other interconnects (e.g., interconnects for electrical coupling) such as metal layers, pads, traces, vias, or passive devices (e.g., inductors, capacitors, resistors), or active devices (e.g., die, transistors). In another aspect, the substrate may comprise a package substrate (including a core or coreless), an interposer (e.g. silicon or glass), a ceramic package, or a printed circuit board. In one aspect, the inductor apparatus may comprise a core. In another aspect, the inductor apparatus may be coreless.

It will be understood that terms such as over, above, below, and under are relative. For example, a device with a component X may be described as being "over" component Y. However, if one flipped the device, the component X may appear to be "under" component Y. Accordingly, such terms (e.g., over, above, below, under) are relative to the drawings as provided.

Exemplary Inductor Apparatus

FIGS. 3A, 3B, 3C, 3D and 3E illustrate an exemplary inductor apparatus 300 in multiple cross sections views, on an X, Y, and Z axis. The inductor apparatus 300 may be three dimensional, in that it may have aspects in the X, Y, and Z planes. The inductor apparatus 300 may comprise an inductor 301. The inductor 301 may be a magnetic inductor. The inductor 301 may be a solenoid inductor. In one aspect, the inductor apparatus 300 may comprise a standalone component configured to be placed with another component that will utilize the magnetic inductor 300. In another aspect, the inductor apparatus 300 may be embedded in a substrate or integrated into a substrate as will be discussed later in the disclosure with respect to FIG. 5.

Figure 3A:
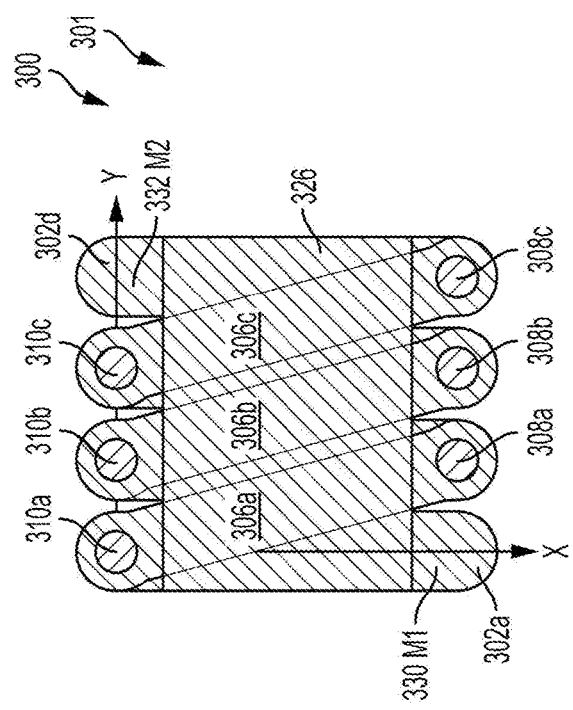
FIG. 3 (which comprises FIGS. 3A-3E) illustrates an inductor apparatus in multiple cross section views, on an X, Y, and Z axis.

FIG. 3A illustrates the exemplary inductor apparatus 300 from a side view, in the X, Y, and Z plane. Specifically, FIG. 3A illustrates the inductor apparatus 300 including a first metal layer 330, the first metal layer 330 includes a plurality of first interconnects 302a, 302b, 302c, 302d. The plurality of first interconnects 302a-d are formed in the first metal layer 330. The inductor apparatus 300 further includes a second metal layer 332, the second metal layer 332 includes a plurality of second interconnects 306a, 306b, 306c. The plurality of second interconnects are formed in the second metal layer 332. A first dielectric layer 360 (shown in FIG. 5) is located between the first metal layer 330 and the second metal layer 332, including between the plurality of first interconnects 302a-d, and the plurality of second interconnects 306a-c. For simplicity, the first dielectric layer 360 is not shown in FIG. 3A-E, however the first dielectric layer 360 will be illustrated and discussed further with respect to FIG. 5 and FIG. 6A.

A plurality of first vias 308a, 308b, 308c and a plurality of second vias 310a, 310b, 310c are configured to couple the plurality of first interconnects 302a-d to the plurality of second interconnects 306a-c.

The inductor apparatus 300 is coupled as follows. A one of the plurality of first interconnects 302a is coupled to a one of the plurality of second vias 310a, the one of the plurality of second vias 310a is coupled to a one of the plurality of second interconnects 306a, the one of the plurality of second interconnects 306a is coupled to a one of the plurality of first vias 308a, the one of the plurality of first vias 308a is coupled to a one of the plurality of first interconnects 302b, the one of the plurality of first interconnects 302b is coupled to a one of the plurality of second vias 310b, the one of the plurality of second vias 310b is coupled to a one of the plurality of second interconnects 306b, the one of the plurality of second interconnects 306b is coupled to a one of the plurality of first vias 308b, the one of the plurality of first vias 308b is coupled to a one of the plurality of first interconnects 302c, the one of the plurality of first interconnects 302c is coupled to a one of the plurality of second vias 310c, the one of the plurality of second vias 310c is coupled to a one of the plurality of the second interconnecst 306c, the one of the plurality of the second interconnects 306c is coupled to a one of the plurality of first vias 308c, and the one of the plurality of the first vias 308c is coupled to a one of the plurality of the first interconnects 302d.

The inductor apparatus 300 includes the inductor 301. The inductor 301 includes the plurality of first vias 308a-c, the plurality of second vias 310a-c, the plurality of first interconnects 302a-d, and the plurality of second interconnects 306a-c. A plurality of inductor loops are formed by the plurality of first vias 308a-c, the plurality of second vias 310a-c, the plurality of first interconnects 302a-d, and the plurality of second interconnects 306a-c.

The inductor 301 may have a width shown in FIG. 3E (e.g., the width may be the measurement taken across one of the plurality of first interconnects such as 302b), and may have a length shown in FIG. 3E. The inductor 301 may have a thickness shown in FIG. 3E (e.g., the thickness may be the height of the plurality of first vias 308a-c plus the thickness of the first metal layer 330 and the second metal layer 332). In other words, the inductor 301 has a size that includes a length, a width, and a thickness.

The inductor 301 also includes a first magnetic layer 320 and a second magnetic layer 322, located between and parallel to the first interconnects 302a-d and the second interconnects 306a-c (e.g., where the first magnetic layer 322 and the second magnetic layer 322 are parallel to the first interconnects 302a-d and the second interconnects 306a-c because they are side by side with the first interconnects 302a-d and the second interconnects 306a-c, but not in the same plane). That is, the first magnetic layer 320 and the second magnetic layer 322 are located between the first metal layer 330 and the second metal layer 332. The first magnetic layer 320 and the second magnetic layer 322 are located at least partially within the plurality of inductor loops. The first magnetic layer 320 and the second magnetic layer 322 are located at least partially within the plurality of first vias 308a-c and the plurality of second vias 310a-c.

In the example of FIG. 3A, the first magnetic layer 320 and the second magnetic layer 322 may be located inside a first dielectric layer 360 (not shown in FIG. 3A-E, however see FIG. 5), where the first dielectric layer 360 is located between the first metal layer 330 and the second metal layer 332. The first dielectric layer 360 will be discussed further with respect to FIG. 5.

FIG. 3E illustrates a size, i.e., a length, a width and a thickness, of any of the first magnetic layer 320, the second magnetic layer 322, a third magnetic layer 324, or a fourth magnetic layer 326. The first and second magnetic layer, 320 and 322 respectively, may have a length that is less than, equal to or greater than the length of the inductor 301. For example, the first and second magnetic layer, 320 and 322 respectively may have a length that is in a range from about half the length of the inductor 301 to about twice the length of the inductor 301. The first and second magnetic layer, 320 and 322 respectively, may have a width such that the first and second magnetic layer, 320 and 322 respectively are located within the inductor loop of inductor 301. In other words, the width of the first and second magnetic layer, 320 and 322 respectively is such that the first and second magnetic layer, 320 and 322 respectively are located between the plurality of first vias 308a-c and the plurality of second vias 310a-d. The first and second magnetic layer, 320 and 322 respectively, may have a thickness of about 1-4 um.

The inductor 301 further includes a third magnetic layer 324. The third magnetic layer 324 is located outside of the plurality of inductor loops. The third magnetic layer 324 is parallel to the plurality of first interconnects 302a-d and is at least partially aligned with the plurality of first interconnects 302a-d. In other words, the third magnetic layer 324 is in a plane below the plurality of first interconnects 302a-d (i.e., parallel). The third magnetic layer 324 is perpendicular to the plurality of first vias 308a-c. The third magnetic layer 324 is perpendicular to the plurality of second vias 310a-c.

The inductor 301 also includes a fourth magnetic layer 326. The fourth magnetic layer 326 is optional. The fourth magnetic layer 326 is located outside of the plurality of inductor loops. The fourth magnetic layer 326 is parallel to the plurality of second interconnects 306a-c and is at least partially aligned with the plurality of second interconnects 306a-c. In other words, the fourth magnetic layer 326 is in a plane above the plurality of second interconnects 306a-c (i.e., parallel). The fourth magnetic layer 326 is perpendicular to the plurality of first vias 308a-c. The fourth magnetic layer 326 is perpendicular to the plurality of second vias 310a-c.

The third and optional fourth magnetic layer, 324 and 326 respectively, may have a length that is less than, equal to, or greater than the length of the inductor 301. For example, the first and second magnetic layer, 324 and 326 respectively may have a length that is within a range from about half the length of the inductor 301 to about twice the length of the inductor 301. The second and third magnetic layer, 324 and 326 respectively, may have a width that is less than, equal to, or greater than the width of the inductor 301. For example, the first and second magnetic layer, 324 and 326 respectively may have a width that is within a range from about half the width of the inductor 301 to about twice the width of the inductor 301. The width of the third and fourth magnetic layer, 324 and 326 respectively is not constrained by being within the plurality of first vias 302a-d and the plurality of second vias 310a-d. The third and fourth magnetic layer, 324 and 326 respectively, may have a thickness of about 1-4 um.

The first magnetic layer 320, the second magnetic layer 322, the third magnetic layer 324 and the fourth magnetic layer 326 may be formed of material that has high permeability and low coercivity. Examples of such material include, but are not limited to iron alloys such as NiFe, or cobalt alloys such as CoTaZr. In one aspect, the first magnetic layer 320, the second magnetic layer 322, the third magnetic layer 324 and the fourth magnetic layer 326 may be formed of one or multiple layers of magnetic material. In another aspect, any one or more of the first magnetic layer 320, the second magnetic layer 322, the third magnetic layer 324 and the fourth magnetic layer 326 may be formed of a first magnetic material and a second magnetic material and a thin oxide layer in between the first magnetic material and the second magnetic material. Each one or more of the first magnetic layer 320, the second magnetic layer 322, the third magnetic layer 324 and the fourth magnetic layer 326 may be comprised of the same material or of different material, or of some combination than any of the other magnetic layers (e.g., the first magnetic layer 320 and the second magnetic layer 322 may be comprised of a first material or composite material, and the third magnetic layer 324 and the fourth magnetic layer may be comprised of a second material or composite material that is different from the first).

Figure 3B:
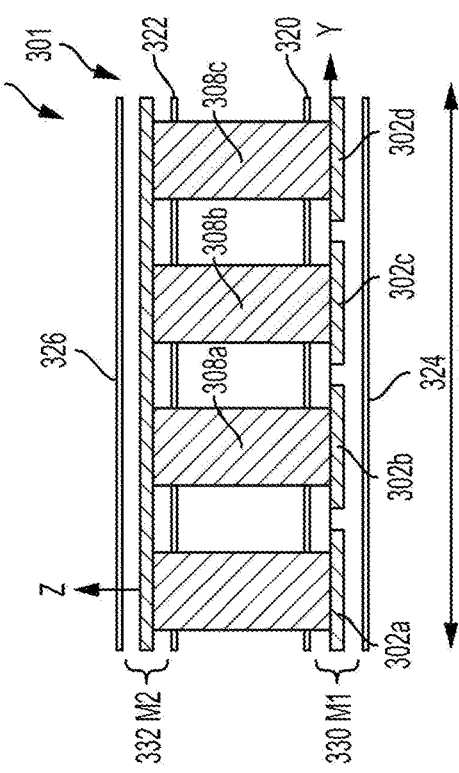

Each one or more of the first magnetic layer 320, the second magnetic layer 322, the third magnetic layer 324 and the fourth magnetic layer 326 may be a different size or the same size (length, width, or thickness), or shape than any of the other magnetic layers. The inductor 301 as shown in FIG. 3A and FIG. 3B, illustrate the first magnetic layer 320, the second magnetic layer 322, the third magnetic layer 324 and the fourth magnetic layer 326 as having a particular size, and shape. However, this is not so limited. In one aspect, the first magnetic layer 320, the second magnetic layer 322, the third magnetic layer 324 and the fourth magnetic layer 326 may be square in shape, or may be rectangular in shape but oriented so that the long edge of the rectangle is along the X axis, rather than along the Y axis as shown. In another aspect, the first magnetic layer 320, the second magnetic layer 322, the third magnetic layer 324 and the fourth magnetic layer 326 may be a polygonal shape. FIG. 3A illustrates the first, second, third, and fourth magnetic layers (i.e., 320, 322, 324, 326 respectively) as a single sheet (i.e., a single sheet of magnetic layer). However, in another aspect, the first magnetic layer 320, the second magnetic layer 322, the third magnetic layer 324 and the fourth magnetic layer 326 may be comprised of a plurality of magnetic layer portions, where the magnetic layer portions can have a variety of shapes including but not limited to square, rectangular or of polygonal shape. In another aspect, the plurality of magnetic layer portions may mirror the shape or size or both, of the plurality of first interconnects 302a-d or the plurality of second interconnects 306a-c. In each of the afore mentioned examples, the each of the magnetic layers (i.e., first magnetic layer 320, second magnetic layer 322, third magnetic layer 324, fourth magnetic layer 326) may be a different size or shape than each of the other magnetic layers (i.e. first magnetic layer 320, second magnetic layer 322, third magnetic layer 324, fourth magnetic layer 326), or may be the same size or shape, or may be some combination of different and same size, shape or orientation.

The inductor 301 generates a first magnetic field when current is applied to the inductor 301. The first magnetic layer 320 and the second magnetic layer 322 increase the inductance of the inductor 301 by constraining and guiding the first magnetic field through, for example, the low permeability material. However, the inductor apparatus 300, including inductor 301, may be placed or integrated into a device (e.g., a substrate) near other electrically conducting metal layers (see third metal layer 534 in FIG. 5 as an example) that may also reduce the inductance. These other electrically conducting metal layers generate a second magnetic field when current is running through them. In such a case, the third magnetic layer 324 and the fourth magnetic layer 326 constrain the second magnetic field within the low permeability material and reduce the effect of the second magnetic field on the inductor 301. For example, the third magnetic layer 324 and the fourth magnetic layer 326 constrain eddy currents (e.g. from surrounding conductors including the third metal layer 534) that would otherwise result in energy loss and loss of inductance for the inductor 301.

FIG. 3B illustrates the exemplary inductor apparatus 300 from a top down view. In the top down view, the inductor apparatus 300 is shown in the X Y plane with the positive Z axis pointing out of the page. From this view, it can also be seen that the plurality of first vias 308a-c and the plurality of second vias 310a-c couple the plurality of first interconnects 302a-d and the plurality of second interconnects 306a-c together. The inductor 301 may form a solenoid. For simplicity, the first, second, third, and fourth magnetic layers (i.e., 320, 322, 324, and 326 respectively) are shown as one shaded area.

Figure 3C:
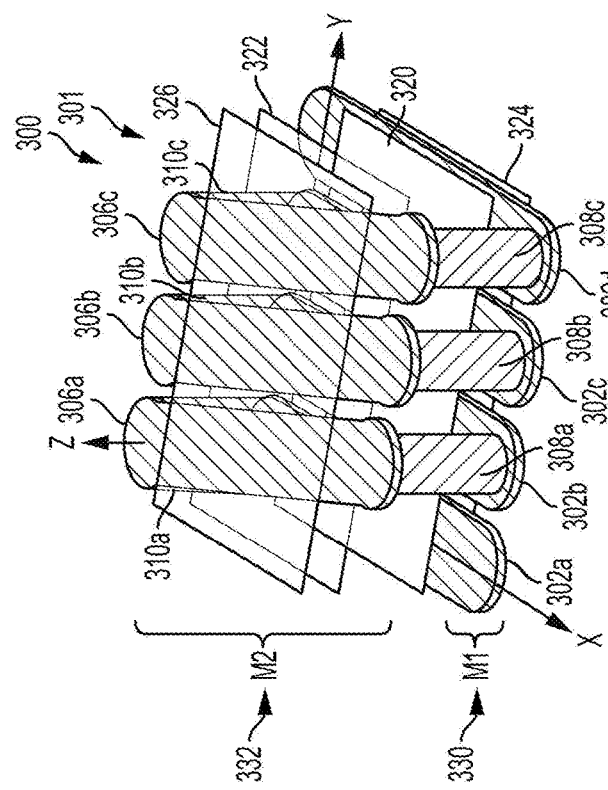

FIG. 3C illustrates the exemplary inductor apparatus 300 from a cross section view. In this cross section view, the inductor apparatus 300 is shown in the X Z plane with the positive Y axis pointing out of the page. FIG. 3C shows a width of the inductor 301, where the width of the inductor 301 can be the measurement of a one of a plurality of first interconnects, for example 302b, or a measurement of a one of the plurality of second interconnects is shown, for example 306a. FIG. 3C also shows a one of a plurality of first vias, for example 308a, and a one of a plurality of second vias, for example 310a. FIG. 3C also shows the first magnetic layer 320, the second magnetic layer 322, the third magnetic layer 324, and the optional fourth magnetic layer 326 in cross section view.

Figure 3D:
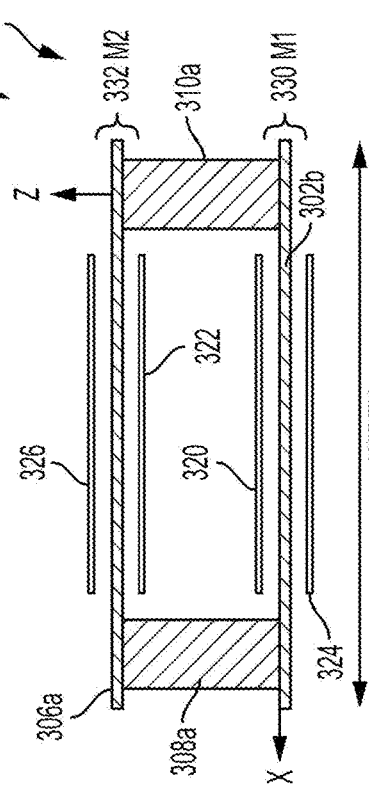

FIG. 3D illustrates the exemplary inductor apparatus 300 from another cross section view. In this cross section view, the inductor apparatus 300 is shown in the Y, Z plane with the positive X axis pointing out of the page. FIG. 3D shows a view of each plurality of first interconnects 302a-d, of each plurality of second interconnects 306a-c, and of the plurality of first vias 308a-c. FIG. 3D also shows the first magnetic layer 320, the second magnetic layer 322, the third magnetic layer 324, and the optional fourth magnetic layer 326 in cross section view. A length of the inductor 301 is also shown.

Although the illustrations of FIG. 3A-E show examples of a single inductor, e.g., inductor 301, it should be understood that the preceding discussion also applies to one or more inductors. Additionally, inductor 301 may be formed with more inductor loops or less inductor loops than what is shown in FIG. 3A-E depending on the desired amount of inductance. Moreover, the number of inductor loops may be an integer or half-integer (e.g., 1, 1½, 2, 2½, etc.).

Exemplary Inductor Apparatus Comprising Two Inductors

Figure 4:
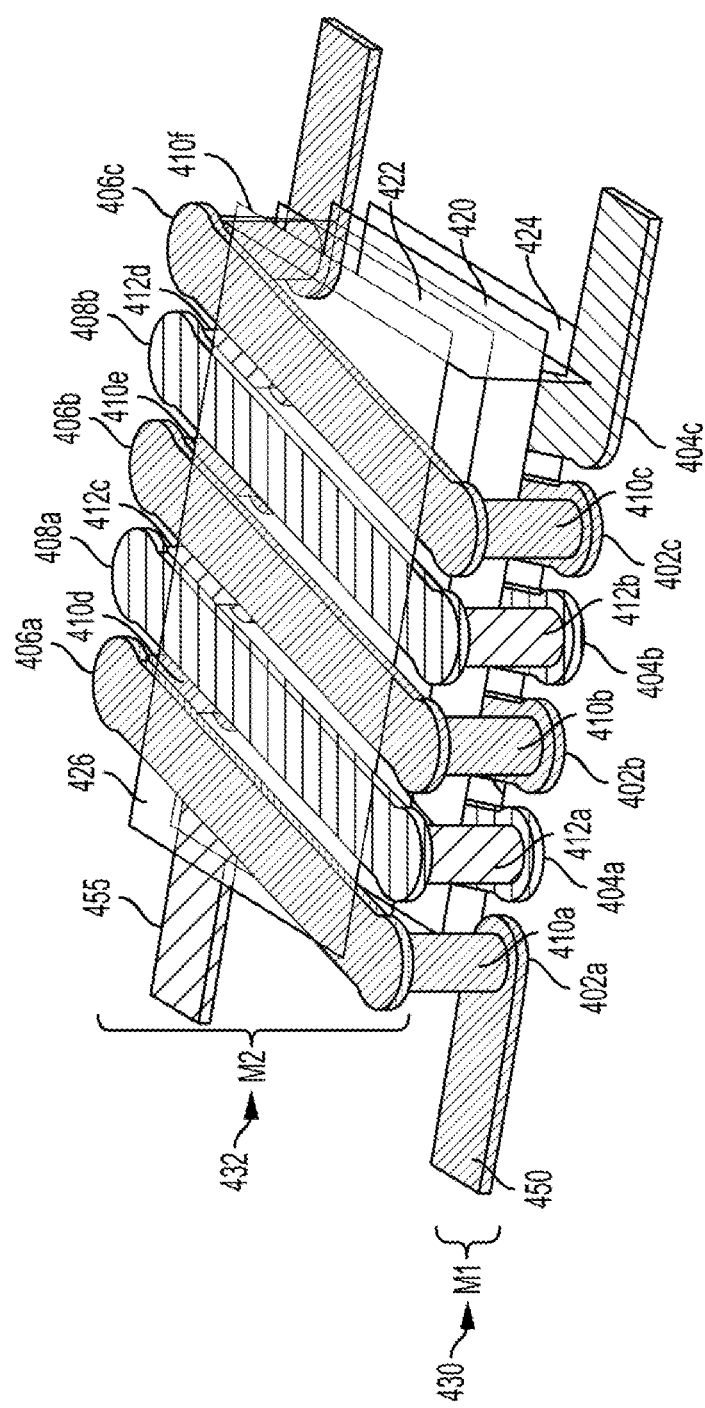
FIG. 4 illustrates an inductor apparatus including two inductors.

FIG. 4 illustrates a three dimensional, inductor apparatus 400 similar to the inductor apparatus 300 of FIG. 3A-E, but with two inductors. FIG. 4 illustrates an exemplary first inductor 450, and an exemplary second inductor 455. Either or both of the first inductor 450 and the second inductor 455 may be the same as the inductor 301 of FIG. 3A-E.

The first inductor 450 includes a plurality of first interconnects 402a, 402b, and 402c, a plurality of second interconnects 406a, 406b, 406c, a plurality of first vias 410a, 410b, 410c, and a plurality of second vias 410d, 410e, 410f. Together, the plurality of first interconnects 402a-c, the plurality of second interconnects 406a-c, the plurality of first vias 410a-c, and the plurality of second vias 410d-f form a plurality of inductor loops of the first inductor 450, and are coupled as described in the discussion for the inductor apparatus 300. The plurality of first interconnects 402a-c are formed in the first metal layer 430, and the plurality of second interconnects 406a-c are formed in the second metal layer 432.

The second inductor 455 includes a plurality of third interconnects 404a, 404b, 404c, a plurality of fourth interconnects 408a, 408b, a plurality of third vias 412a, 412b, and a plurality of fourth vias 412c,d. Together, the plurality of third interconnects 404a-c, the plurality of fourth interconnects 408a,b, the plurality of third vias 412a,b, and the plurality of fourth vias 412c,d form a plurality of inductor loops of the second inductor 455, and are coupled as described in the discussion for the inductor apparatus 300. The plurality of third interconnects 404a-c are formed in the first metal layer 430, and the plurality of fourth interconnects 408a,b are formed in the second metal layer 432.

Figure 5:
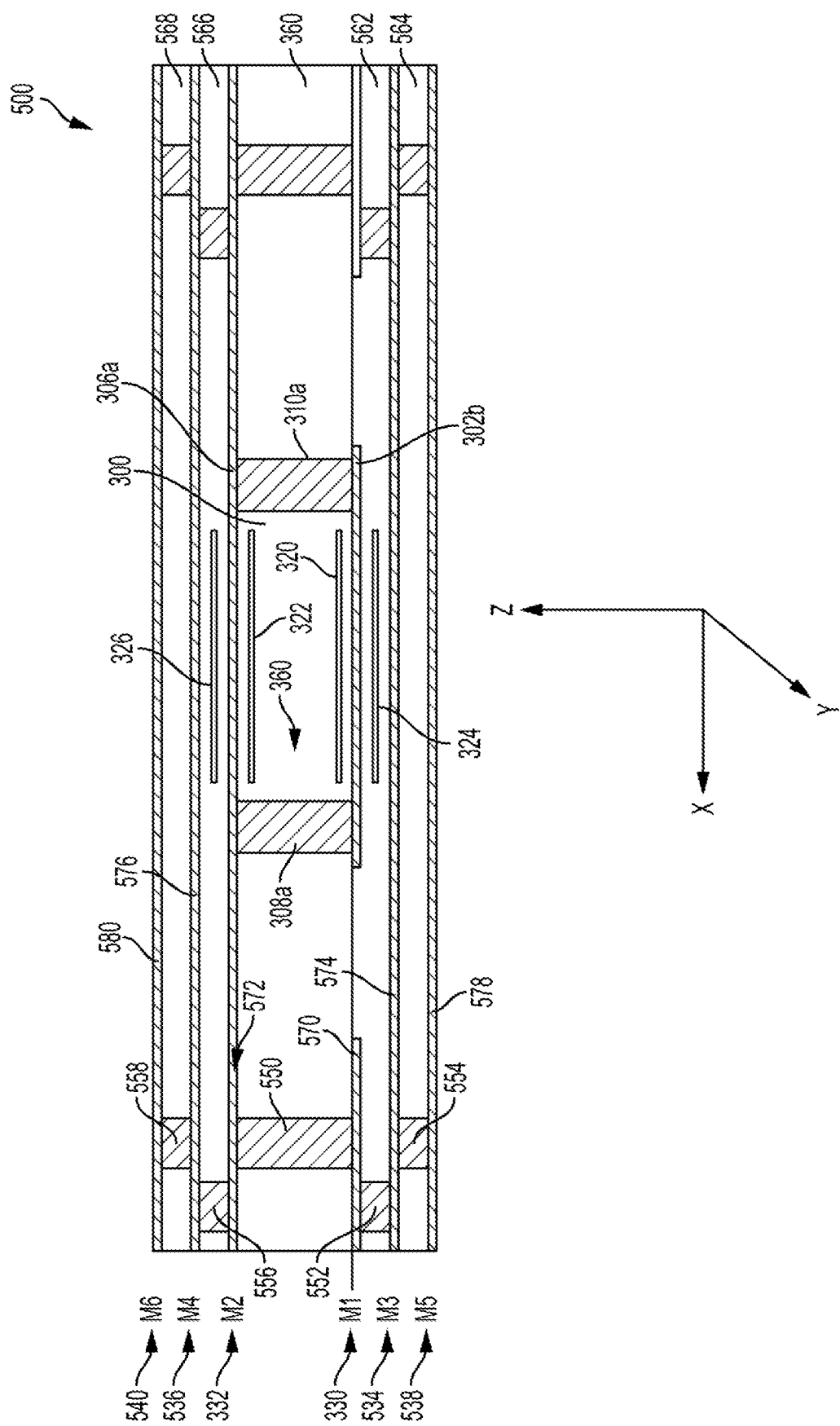
FIG. 5 illustrates a substrate including an inductor apparatus.

A dielectric layer 460 (for simplicity the dielectric layer 460 is not shown here, but see FIG. 5) is located between the first metal layer 430 and the second metal layer 432, including between the plurality of inductor loops of the first inductor 450, and the plurality of inductor loops of the magnetic inductor 455.

Similar to the inductor 301, a first magnetic layer 420 and a second magnetic layer 422 are located at least partially within the plurality of inductor loops of the first inductor 450 and at least partially within the plurality of inductor loops of the second inductor 455. It will be understood, that while the first magnetic layer 420 and the second magnetic layer 422 are at least partially within the inductor loops (of first and second inductor 450 and 455 respectively), the first magnetic layer 420 and the second magnetic layer 422 may have a length that extends beyond the first inductor 450 and the second inductor 455. Likewise, a third magnetic layer 424 and an optional fourth magnetic layer 426 are located outside of the plurality of inductor loops of the first inductor 450 and outside of the plurality of inductor loops of the second inductor 455. The third magnetic layer 424 and the optional fourth magnetic layer 426 may have a length or width that is less than or greater than the first inductor 450 and the second inductor 455. The first magnetic layer 420, the second magnetic layer 422, the third magnetic layer 424, and the fourth magnetic layer 426 are the same as described in the discussion for FIG. 3A-E.

Although the illustrations of FIG. 4 show examples of two inductors (e.g., a first inductor 450 and a second inductor 455), a person of skill in the art may include more or less inductors, with more or less inductor loops depending on the needs of the design. The first inductor 450 and the second inductor 455 may have the same number of inductor loops as each other, or they may have a different number of inductor loops as each other. In other words, one of either the first inductor 450 or the second inductor 455 may have more inductor loops than the other. For example, the second inductor 455 may have additional inductor loops (not shown) than the third interconnect 404c has, and these additional inductor loops do not interleave with those of the first inductor 450. The number of inductor loops of the first inductor 450 and the second inductor 455 may be an integer or half integer.

Exemplary Substrate Comprising an Inductor Apparatus

FIG. 5 illustrates the inductor apparatus 300 of FIG. 3A-E, embedded or integrated in a substrate 500, in the X, Z plane with the positive Y axis pointing out of the page (like FIG. 3C).

In one aspect, the substrate 500 may be a device that includes the inductor apparatus 300 as well as other components or structures such as other interconnects (e.g., interconnects for electrical coupling such as metal layers, pads, traces, vias), or passive devices (e.g., inductors, capacitors, resistors), or active devices (e.g., die, transistors). In one aspect, the substrate 500 may comprise a package substrate, (including a core or coreless), an interposer (e.g., silicon or glass), a ceramic package, or a PCB.

FIG. 5 illustrates the substrate 500 including: the inductor apparatus 300 previously described (including the first magnetic layer 320, the second magnetic layer 322, the third magnetic layer 324, and the optional fourth magnetic layer 326), the first metal layer 330 further including a plurality of third interconnects 570 (e.g., pad, trace), the second metal layer 332 further including a plurality of fourth interconnects 572, a third metal layer 534 including a plurality of fourth interconnects 574 (e.g., pad, trace), a fourth metal layer 536 including a plurality of fifth interconnects 576 (e.g., pad, trace), a fifth metal player 538 including a plurality of sixth interconnects 578 (e.g., pad, trace, redistribution layer), and a sixth metal player 540 including a plurality of seventh interconnects 580 (e.g., pad, trace, redistribution layer).

Further, the substrate 500 includes the first dielectric layer 360 located between the first metal layer 330 and the second metal layer 332, between the plurality of first interconnects 302a-d and the plurality of second interconnects 306a-c, between the first magnetic layer 320 and the second magnetic layer 326, between the first plurality of first interconnects 302a-d and the first magnetic layer 320, and between the plurality of second interconnects 306a-c and the second magnetic layer 326. In other words, the first magnetic layer 320 and the second magnetic layer 322 may be located inside of the first dielectric layer 360. In one aspect, the first dielectric layer 360 is a prepreg material. In this aspect, the first dielectric layer 360 comprises a core of the substrate 500 (e.g., substrate 500 is a traditional substrate with a core). In another aspect, the first dielectric layer 360 may be a dielectric layer of a coreless substrate (e.g., substrate 500 is a coreless substrate).

A second dielectric layer 562 is located between the first metal layer 330 and the third metal layer 534, between the plurality of first interconnects 302a-d and the third metal layer 534, between the plurality of first interconnects 302a-d and the third magnetic layer 324, and between the third magnetic layer 324 and the third metal layer 534. In other words, the third magnetic layer 324 may be located inside of the second dielectric layer 562. A third dielectric layer 564 is located between the third metal layer 534 and the fifth metal layer 538, between the plurality of second interconnects 306a-c and the fifth metal layer 562, between the plurality of second interconnects 306a-c and the optional fourth magnetic layer 326, and between the optional fourth magnetic layer 326 and the fifth metal layer 538. In other words, the fourth magnetic layer 326 may be located inside of the third dielectric layer 564.

A fourth dielectric layer 566 is located between the second metal layer 332 and the fourth metal layer 536, including between the plurality of second interconnects 306a-c and the fourth metal layer 536. A fifth dielectric layer 568 is located between the sixth metal layer 540 and the fourth metal layer 536. The first dielectric layer through the sixth dielectric layer (i.e., 360, 562, 564, 566, and 568 respectively) are configured to isolate the first metal layer through the sixth metal layers (i.e., 330, 332, 534, 536, 538, and 540 respectively).

Each one or more of the first dielectric layer 360, the second dielectric layer 562, the third dielectric layer 564, the fourth dielectric layer 566, and the fifth dielectric layer 568 may be of the same material, different material or combination of materials, such as but not limited to prepreg, insulating film (e.g., Ajinomoto Build-up Film), or laminate film.

A plurality of first vias 554 (although only one via is shown in this view, it will be understood there are a plurality) couples the plurality of sixth interconnects 578 to the plurality of fourth interconnects 574, a plurality of second vias 552 couples the plurality of fourth interconnects 574 to the plurality of third interconnects 570, a plurality of third vias 550 couples the plurality of third interconnects 570 to the plurality of fourth interconnects 574, a plurality of fourth vias 556 couples the plurality of fourth interconnects 574 to the plurality of fifth interconnects 576, and a plurality of fifth vias 558 couples the plurality of fifth interconnects 576 to the plurality of seventh interconnects 580.

As mentioned, the substrate 500 may comprise a package substrate (including a core or coreless), an interposer (e.g. silicon or glass), a ceramic package, or a printed circuit board. In one aspect, where the substrate 500 comprises a package substrate, other components not shown may be included such as interconnects for coupling to a die and a PCB, solder balls, solder paste, copper pillars. In another aspect, where the substrate 500 comprises an interposer, other components not shown may be included such as interconnects for coupling to a die or a package substrate. In another aspect, where the substrate 500 comprises a PCB, other components not shown may be included such as interconnects for coupling to a package substrate or passive devices.

Although, FIG. 5 illustrates a single inductor apparatus 300 (i.e., a single inductor 301) embedded or integrated into substrate 500, it should be understood that the preceding discussion also applies to one or more inductor apparatus. In one aspect, the inductor apparatus 400 may be embedded or integrated into the substrate 500 (instead of inductor apparatus 300). In another aspect, the substrate 500 may have multiple inductors (such as multiple inductor apparatus 300). In any of these aspects, the inductor 301 may be formed with more or less inductor loops than what is shown in FIG. 3A-E or FIG. 4.

Exemplary Sequence for Manufacturing an Inductor Apparatus Embedded in a Substrate In some implementations, manufacturing an inductor apparatus includes several processes. FIG. 6 (which includes FIGS. 6A-6F) illustrates an exemplary sequence for manufacturing an inductor apparatus 699 including an inductor 698, embedded in a substrate 600. The inductor apparatus 699 may be three dimensional in that it may have aspects in the X, Y, and Z axis. The inductor apparatus 699 and the substrate 600 are shown in cross-section view, in the X, Z plane. In some implementations, the sequence of FIGS. 6A-6F may be used to manufacture the inductor apparatus 300, the inductor 301 and the substrate 500. It should be noted that the sequence shown in FIGS. 6A-6F may combine one or more stages to simplify and clarify the sequence. In some implementations, the order of the processes may be changed or modified.

Figure 6A:
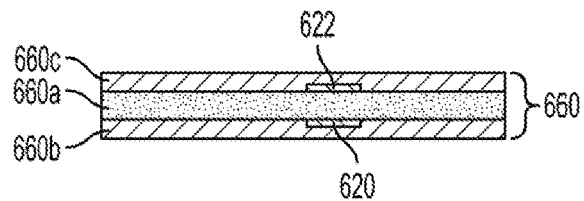
FIG. 6 (which comprises FIGS. 6A-6F) illustrates an example of a sequence for fabricating an inductor apparatus embedded in a substrate.

FIG. 6A illustrates first dielectric layer 660 including a first dielectric portions 660*a*, 660*b*, and 660*c*. The first dielectric layer 660 (including the first dielectric portions 660*a*, 660*b* and 660*c*) may be the same as the first dielectric layer 360. The first dielectric portion 660*a* is provided.

A first magnetic layer 620 is deposited onto a first lateral side of the first dielectric portion 660*a*, and a second magnetic layer 622 is deposited onto a second lateral side of the first dielectric portion 660*a*. The first magnetic layer 620 may be the same as the first magnetic layer 320, and the second magnetic layer 622 may be the same as the second magnetic layer 322 (including size, shape, orientation). The first dielectric portion 660*b* is deposited to at least partially cover the first lateral side of dielectric portion 660*a* and to cover the first magnetic layer 620. The first dielectric portion 660*c* is deposited to at least partially cover the second lateral side of the first dielectric portion 660*a* and to cover the second magnetic layer 622. It should be noted that the first dielectric portion 660*c* may be deposited before the first dielectric portion 660*b*.

It is important to note that the substrate 600 may either be a substrate with a core, or may be a coreless substrate. In one aspect where substrate 600 is a coreless substrate, the first dielectric layer 660 may comprise the same materials (i.e., first dielectric layer portion 660*a*, 660*b* and 660*c* may all comprise the same materials). In another aspect, where substrate 600 is a substrate with a core, first dielectric portion 660*a* may comprise a prepreg material. In this aspect, the first dielectric portion 660*a* that is prepreg, has a greater thickness than in the previous aspect where the first dielectric portion 660*a* is any dielectric material (i.e., where the substrate is coreless). Regardless whether the substrate 600 is a substrate with a core, or a coreless substrate, the first magnetic layer and the second magnetic layer is surrounded by the first dielectric layer 660.

Figure 6B:
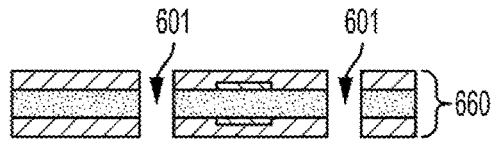

FIG. 6B illustrates forming a plurality of via holes 601 through the first dielectric layer 660. The plurality of via holes 601 are formed by drilling or laser drilling. Shown from the X, Z plane, FIG. 6B illustrates the plurality of via holes 601 as including two via holes for simplicity. However, the plurality of via holes 601 may correspond to the plurality of first vias 302*a*-*d* and the plurality of second vias 306*a*-*c* shown in FIG. 3A. Moreover, it should be understood that additional via holes may be formed to obtain the desired inductance.

Figure 6C:
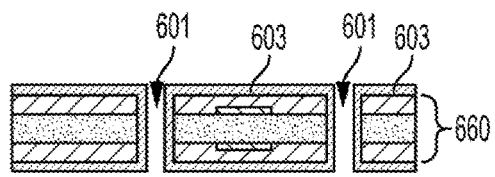

FIG. 6C illustrates optionally depositing a seed layer 603 on any portions of the first dielectric layer 660 that will later be patterned with metal. Depositing a seed layer 603 may be beneficial where copper is used for patterning of the metal layers such as first metal layer 630 (this is discussed further with respect to FIG. 6D). In one aspect, the seed layer 603 is deposited so that it covers all exposed (i.e., outer areas and the plurality of via holes) areas of the first dielectric layer 660. In this aspect, the seed layer 603 is deposited so that it covers at least a lateral side of first dielectric portion 660*c*, a lateral side of first dielectric portion 660*b*, and the sidewalls of the plurality of via holes 601.

Figure 6D:
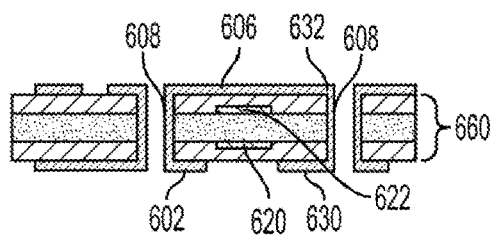

FIG. 6D illustrates patterning of a first metal layer 630 including patterning of a plurality of first interconnects 602, patterning of a second metal layer 632 including patterning of a plurality of second interconnects 606, and formation of a plurality of first vias 608. Although not shown in FIG. 6D which only shows the X, Z plane, the formation of a plurality of second vias (e.g., 310*a*-*c*) may also be performed. The patterning occurs such that the plurality of first interconnects 602, and the plurality of second interconnects 602 are coupled together through the plurality of first vias 608 and the plurality of second vias (e.g., 310*a*-*c*).

The plurality of first vias 608 may be the same as the plurality of first vias 308*a*-*c* of FIG. 3A. The plurality of second vias may be the same as the plurality of second vias 310*a*-*c* shown in FIG. 3A. The plurality of first interconnects 602 may be the same as the plurality of first interconnects 302*a*-*d*, and the plurality of second interconnects 606 may be the same as the plurality of interconnects 306*a*-*c*. The patterning of the plurality of first interconnects 302*a*-*d*, the plurality of second interconnects 606 and the plurality of first vias 608 and the plurality of second vias (e.g., 310*a*-*c*) may include providing a photo resist layer (not shown) on areas where metal patterning is not desired, then depositing a metal so that the desired patterns (e.g., interconnects, traces, vias) are formed, and finally stripping the photo resist layer.

Figure 6E:
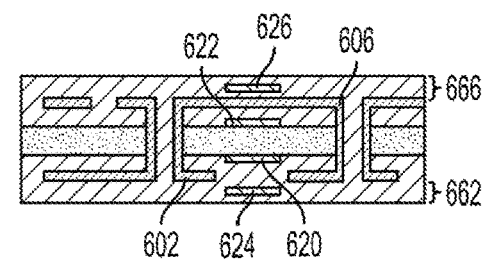

FIG. 6E illustrates depositing a third magnetic layer 624, an optional fourth magnetic layer 626, a second dielectric layer 662 and a third dielectric layer 666. The third magnetic layer 624 is surrounded by the second dielectric layer 662 and the optional fourth magnetic layer is surrounded by the third dielectric 666. The third magnetic layer 624 may be the same as the third magnetic layer 324, and the optional fourth magnetic layer 626 may be the same as the optional fourth magnetic layer 326. The second dielectric material 662 and the third dielectric material 666 may be the same as the second dielectric material 562 and the fourth dielectric material 566 respectively of FIG. 5.

FIG. 6E illustrates the inductor apparatus 699 (corresponding to the inductor apparatus 300), and the inductor 698 (and its inductor loops). The inductor 698 includes the plurality of first vias 608 (corresponding to 308*a*-*c*), the plurality of second vias (not shown in FIG. 6, but see 310a-c), the plurality of first interconnects 602 and the plurality of second interconnects 606, the first magnetic layer 620, the second magnetic layer 622, the third magnetic layer 624, and the optional fourth magnetic layer 626. It is important to note, that the inductor apparatus 699 may comprise a standalone component configured to be placed with another component that will utilize the magnetic inductor 300. In another aspect, the inductor apparatus 699 (or 300) may be embedded in a substrate (e.g., 600) or integrated into a substrate (e.g., 600).

Figure 6F:
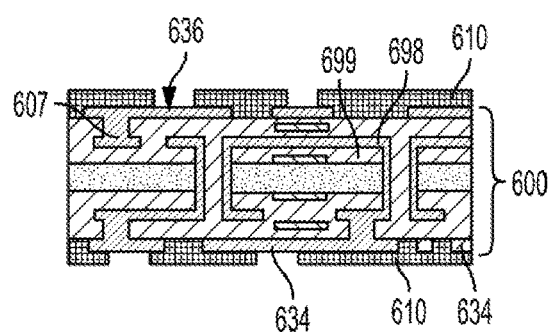

FIG. 6F illustrates the inductor apparatus 699 after a third metal layer 634, and fourth metal layer 636 have been patterned, and after formation of via 607, and after solder resist 610 has been deposited. In one aspect, the device of FIG. 6F may comprise a substrate such as the substrate 500 (see FIG. 5). In another aspect, the device of FIG. 6F may comprise a package substrate (including a core or coreless), an interposer (e.g., silicon or glass), a ceramic package, or a printed circuit board. In one aspect, FIG. 6F illustrates the inductor apparatus 699 embedded or integrated into substrate 600.

Exemplary Flow Diagram of a Method for Manufacturing an Inductor Apparatus

Figure 7:
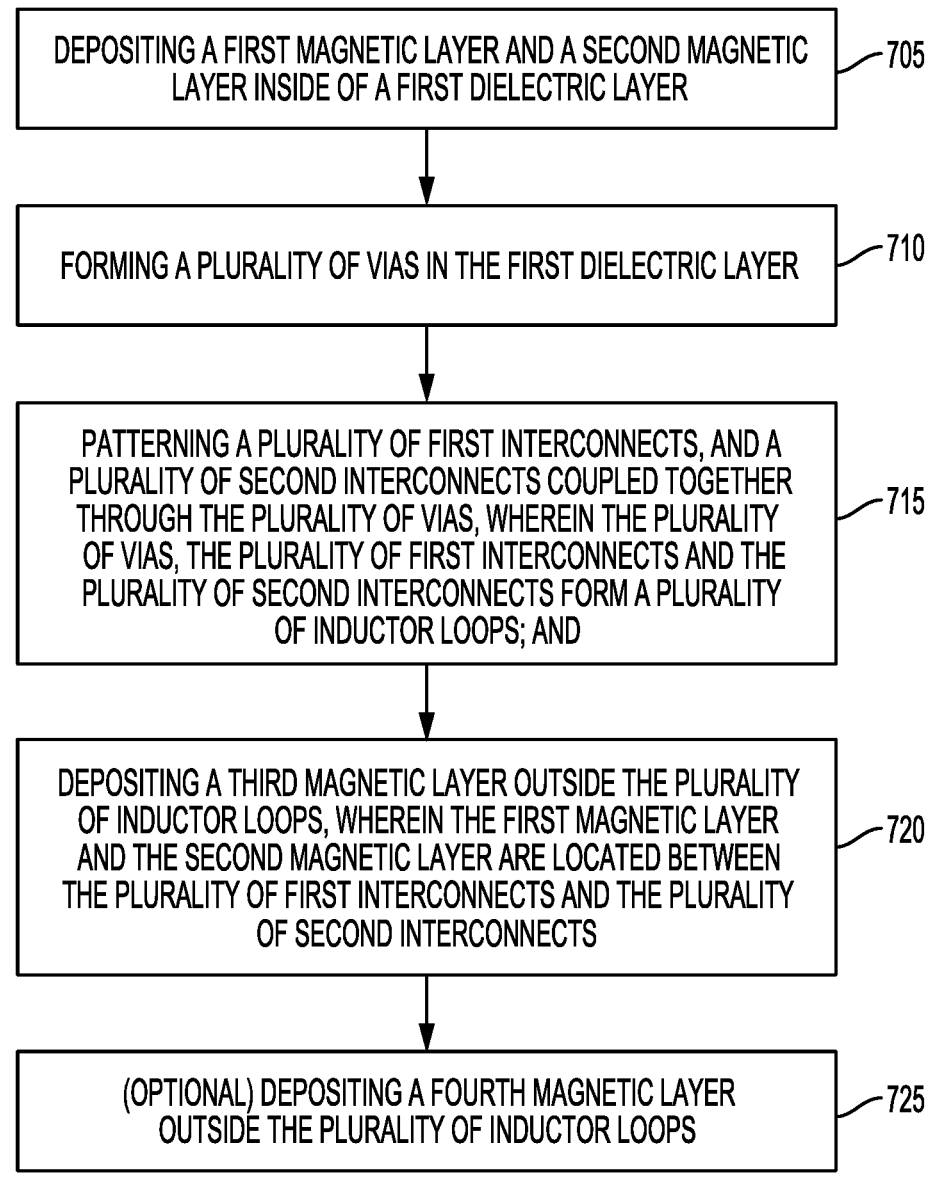
FIG. 7 illustrates an exemplary flow diagram of a high level method for manufacturing an inductor apparatus.

FIG. 7 illustrates an exemplary flow diagram of a high level method for manufacturing an inductor apparatus. It should be noted that for the purpose of clarity and simplification, the flow diagram of FIG. 7 does not necessarily include all the steps of manufacturing an inductor apparatus. Moreover, in some instances, several steps may have been combined into a single step to simplify the description of the sequences.

As shown in FIG. 7, the method includes depositing (at step 705) a first magnetic layer and a second magnetic layer inside of a first dielectric layer. Different implementations may deposit the first magnetic layer and the second magnetic layer differently. FIG. 6A illustrates an example of depositing the first magnetic layer 620 and the second magnetic layer 622 inside of the first dielectric layer 660.

The method (at step 710) illustrates forming a plurality of vias in the first dielectric. FIG. 6B illustrates forming the via holes 601. FIG. 6D illustrates forming the plurality of vias, such as the plurality of first vias 608 (and discusses forming the plurality of second vias 610, not shown) in the first dielectric layer 660.

The method (at step 715) illustrates patterning a plurality of first interconnects, and a plurality of second interconnects coupled together through the plurality of vias, wherein the plurality of vias, the plurality of first interconnects and the plurality of second interconnects form a plurality of inductor loops. For example, FIG. 6D illustrates the patterning of the plurality of first interconnects 602 and the plurality of second interconnects 606, and shows the first and second interconnects, 602 and 606 respectively, coupled together by the first plurality of vias 608 (and second plurality of vias 610, not shown).

The method (at step 720) illustrates depositing a third magnetic layer outside the plurality of inductor loops, wherein the first magnetic layer and the second magnetic layer are located between the plurality of first interconnects and the plurality of second interconnects. For example, FIG. 6E illustrates depositing the third magnetic layer 624 outside the plurality of inductor loops. In one aspect, depositing the third magnetic layer 624 outside the plurality of inductor loops includes depositing the third magnetic layer 624 in a plane that is underneath another plane where the plurality of first interconnects 602a-d are located. FIG. 6D illustrates the first magnetic layer 620 and the second magnetic layer 622 are located between the plurality of first interconnects 602 and the plurality of second interconnects 606.

The optional method (at step 725) illustrates depositing a fourth magnetic layer outside the plurality of inductor loops. For example, FIG. 6E illustrates depositing the fourth magnetic layer 626 outside the plurality of inductor loops. In one aspect, depositing the fourth magnetic layer 626 outside the plurality of inductor loops includes depositing the fourth magnetic layer 626 in a plane that is above (a second) another plane where the plurality of second interconnects 606a-c are located.

Figure 8:
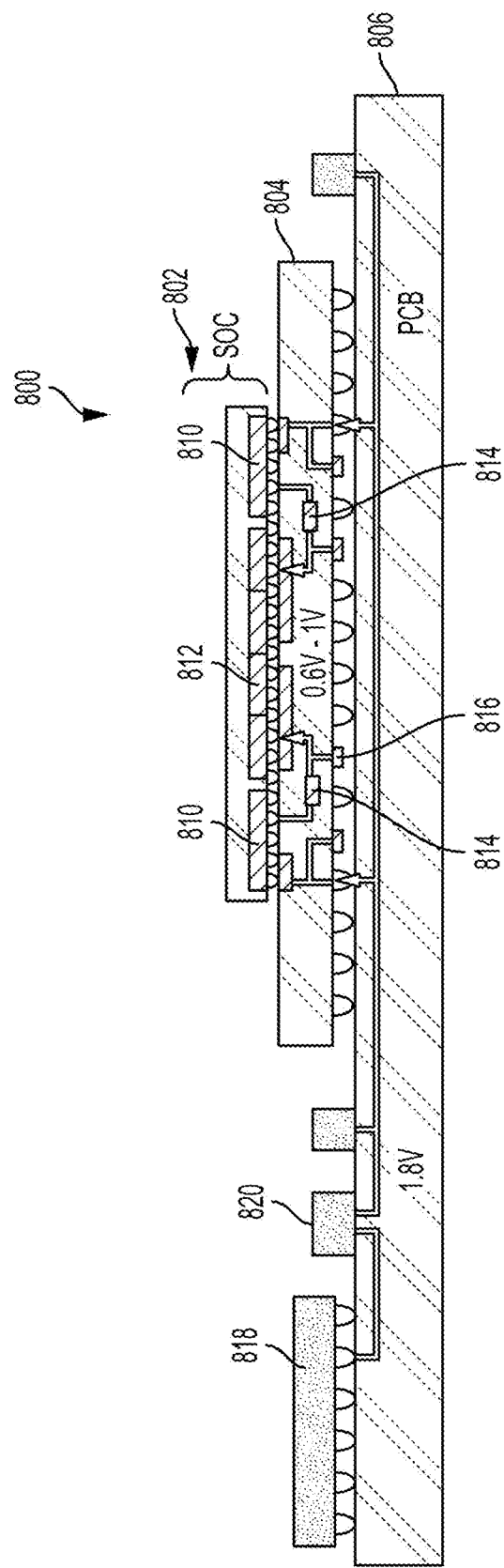
FIG. 8 illustrates a system comprising a voltage regular, and a package substrate including an inductor apparatus.

Exemplary System Comprising a Voltage Regular, and a Package Substrate Including an Inductor Apparatus FIG. 8 illustrates an exemplary system comprising a voltage regulator that includes an inductor apparatus. For simplicity, FIG. 8 illustrates various components coupled together by simple lines, i.e. interconnects. It shall be understood, however, that various interconnects may be used, including fine lines, traces, embedded traces, vias, or redistribution layers (not shown).

Specifically, FIG. 8 illustrates a system-on-chip ("Sort") 802, a package substrate 804, a PCB 806, a power management integrated circuit (PMIC) 818, and surface mounted passive device 820. The SoC 802 includes one or more voltage regulators 810, and one or more loads 812. Although the SoC 802 is shown as a single device, in another aspect, the voltage regulator 810 may be in a separate die (i.e., separate from the load 812). The package substrate 804 includes an inductor apparatus 814. The inductor apparatus 814 may be the inductor apparatus 300 or may be the inductor apparatus 400 (including the first inductor 450 and the second inductor 455). The package substrate 804 may be the substrate 500, but with additional components.

The PMIC 818 is coupled to the surface mounted passive device 820, the surface mounted passive device 820 is coupled to the PCB 806, the PCB 806 is coupled to the package substrate 804, the package substrate 804 is coupled to the voltage regulator 810, the voltage regulator 810 is coupled to the inductor apparatus 814, the inductor apparatus 814 may be coupled to a capacitor, and may also be coupled to the load 812.

In one aspect, the voltage regulator 810 is configured to receive a first voltage, such as 1.8 volts, from a voltage source (not shown). The voltage regulator 810 may be configured to down convert the received 1.8 volts to a second voltage, such as about 0.6-1.0 volts. The second voltage is supplied to the load 812 by way of the inductor apparatus 814. In another aspect, the voltage regulator 810 may be a buck regulator configured to step down the received first voltage to the second voltage.

Exemplary Electronic Devices

Figure 9:
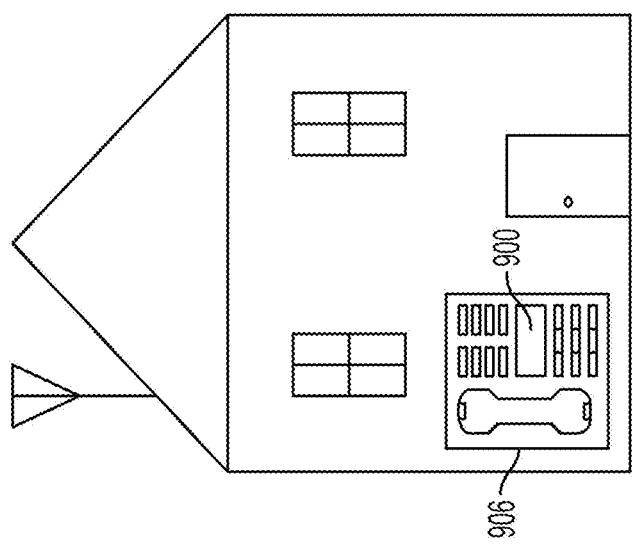
FIG. 9 illustrates various electronic devices that may include the various substrates, integrated devices, integrated device packages, semiconductor devices, dies, integrated circuits, packages, or inductors described herein.
Figure 9:
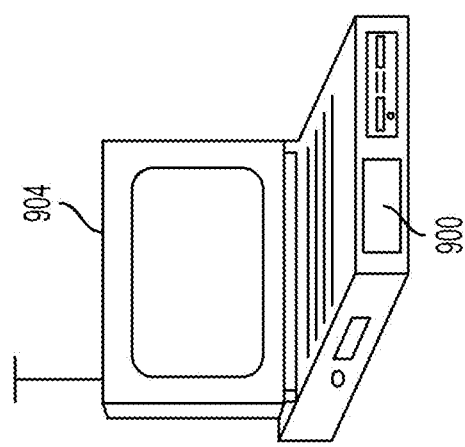
Figure 9:
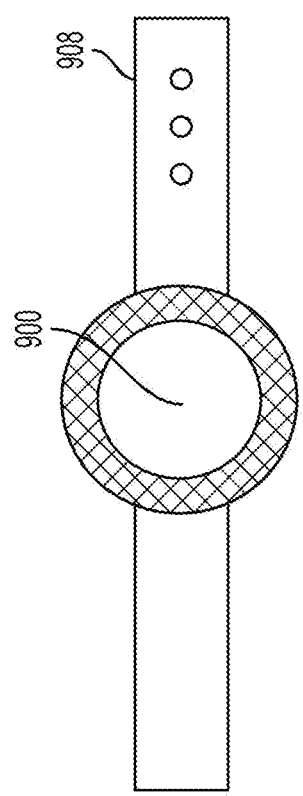
Figure 9:
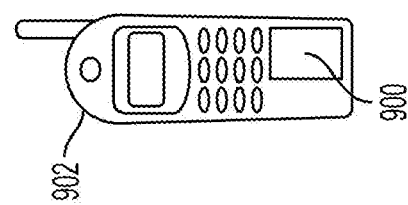

FIG. 9 illustrates various electronic devices that may be integrated with any of the aforementioned substrate, integrated device, semiconductor device, integrated circuit, die, interposer, package, or inductor apparatus. For example, a mobile phone device 902, a laptop computer device 904, a fixed location terminal device 906, a wearable device 908 may include an integrated device 900 as described herein. The integrated device 900 may be, for example, any of the substrate, integrated circuits, dies, integrated devices, integrated device packages, integrated circuit devices, device packages, integrated circuit (IC) packages, package-on-package devices described herein. The devices 902, 904, 906, 908 illustrated in FIG. 9 are merely exemplary. Other electronic devices may also feature the integrated device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 3A-E through FIG. 8 may be rearranged and/or combined into a single component, process, feature or function or embodied in several components, processes, or functions. Additional elements, components, processes, and/or functions may also be added without departing from the disclosure. It should also be noted that FIGS. 3A-E through FIG. 8 and its corresponding description in the present disclosure is not limited to substrates. In some implementations, FIGS. 3A-E through FIG. 8 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "traverse" as used herein, means to go across and includes going all the way across an object or partially across an object.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various aspects of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An inductor apparatus comprising:
   a first metal layer including a plurality of first interconnects;
   a second metal layer including a plurality of second interconnects;
   a first dielectric layer between the first metal layer and the second metal layer; and
   an inductor, the inductor including:
      a plurality of vias, the plurality of vias configured to couple the plurality of first interconnects to the plurality of second interconnects;
      a plurality of inductor loops formed by the plurality of vias, the plurality of first interconnects and the plurality of second interconnects;
      a first magnetic layer and a second magnetic layer between the plurality of first interconnects and the plurality of second interconnects; and
      a third magnetic layer outside of the plurality of inductor loops; and
   a second dielectric layer surrounding each of a first side, a second side, a third side, and a fourth side of the third magnetic layer.

2. The inductor apparatus of claim 1, wherein the third magnetic layer is parallel to the plurality of first interconnects, at least partially aligned with the first interconnects, and located under the inductor.

3. The inductor apparatus of claim 2, wherein the third magnetic layer comprises a single sheet.

4. The inductor apparatus of claim 2, wherein the third magnetic layer comprises a plurality of magnetic layer portions.

5. The inductor apparatus of claim 1, further comprising:
   a length of the third magnetic layer, wherein the length of the third magnetic layer is greater than or equal to a length of the inductor.

6. The inductor apparatus of claim 1, further comprising:
   a length of the third magnetic layer, wherein the length of the third magnetic layer is less than or equal to a length of the inductor.

7. The inductor apparatus of claim 1, further comprising:
   a width of the third magnetic layer, wherein the width of the third magnetic layer is greater than or equal to a width of the inductor.

8. The inductor apparatus of claim 1, further comprising:
   a width of the third magnetic layer, wherein the width of the third magnetic layer is less than or equal to a width of the inductor.

9. The inductor apparatus of claim 1, wherein the first magnetic layer and the second magnetic layer are at least partially within the plurality of inductor loops, and wherein the first magnetic layer and second layer are surrounded by the first dielectric layer.

10. The inductor apparatus of claim 1, wherein the first magnetic layer and the second magnetic layer are between the plurality of vias.

11. The inductor apparatus of claim 1, further comprising:
    a fourth magnetic layer outside the plurality of inductor loops.

12. The inductor apparatus of claim 11, wherein the fourth magnetic layer is parallel to the plurality of second interconnects, at least partially aligned with the plurality of second interconnects, and located over the inductor.

13. The inductor apparatus of claim 11, wherein the third magnetic layer and the fourth magnetic layer are perpendicular to the plurality of vias.

14. The inductor apparatus of claim 11, wherein the fourth magnetic layer comprises a single sheet parallel to the plurality of second interconnects.

15. The inductor apparatus of claim 11, further comprising:

a width of the fourth magnetic layer, wherein the width of the fourth magnetic layer is greater than or equal to a width of the inductor.

16. The inductor apparatus of claim 11, further comprising:
a width of the fourth magnetic layer, wherein the width of the fourth magnetic layer is less than or equal to a width of the inductor.

17. The inductor apparatus of claim 11, further comprising:
a length of the fourth magnetic layer, wherein the length of the fourth magnetic layer is greater than or equal to a length of the inductor.

18. The inductor apparatus of claim 11, further comprising:
a length of the fourth magnetic layer, wherein the length of the fourth magnetic layer is less than or equal to a length of the inductor.

19. The inductor apparatus of claim 11, wherein the fourth magnetic layer comprises a plurality of magnetic layer portions.

20. The inductor apparatus of claim 11 further comprising:
a third dielectric layer, wherein the fourth magnetic layer is surrounded by the third dielectric layer.

21. The inductor apparatus of claim 1, further comprising a third metal layer under the first metal layer, wherein the third magnetic layer is between the third metal layer and the first metal layer.

22. The inductor apparatus of claim 21, further comprising a fourth metal layer over the second metal layer, wherein a fourth magnetic layer is between the third metal layer and the second metal layer, and wherein the fourth magnetic layer is parallel to the plurality of second interconnects.

23. The inductor apparatus of claim 22, wherein the third magnetic layer and the fourth magnetic layer are configured to constrain a magnetic flux of the third metal layer and fourth metal layer.

24. The inductor apparatus of claim 1, wherein the inductor apparatus further comprises a device selected from the group consisting of a package substrate, an interposer, a ceramic package, and a printed circuit board.

25. The inductor apparatus of claim 1, wherein the inductor is configured to be coupled to a voltage regulator.

26. The inductor apparatus of claim 1, wherein the third magnetic layer has a thickness of about 0.1 to 6 microns.

27. The inductor apparatus of claim 1, further comprising:
another inductor including a plurality of another inductor loops, wherein the third magnetic layer is outside of the plurality of second inductor loops; and
a fourth magnetic layer, wherein the fourth magnetic layer is outside of the plurality of inductor loops and outside the plurality of another inductor loops.

28. The inductor apparatus of claim 1, wherein the inductor apparatus is incorporated into a device selected from a group consisting of a music player, a video player, an entertainment unit, a navigation device, a communications device, a mobile device, a mobile phone, a smart phone, a personal digital assistant, a fixed location terminal or server, a tablet computer, a wearable computing device, and a laptop computer.

* * * * *